US012785696B2

(12) United States Patent
Liao et al.

(10) Patent No.: US 12,785,696 B2
(45) Date of Patent: Nov. 3, 2026

(54) MULTI-PHASE DUAL-EDGE DIGITAL PULSE WIDTH MODULATION DEVICE

(71) Applicant: National Yang Ming Chiao Tung University, Hsinchu City (TW)

(72) Inventors: Yu-Te Liao, Hsinchu City (TW); Ying-Yu Yang, Yuanlin City (TW); Yi-Ting Lin, Kaohsiung City (TW)

(73) Assignee: NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 131 days.

(21) Appl. No.: 19/018,491

(22) Filed: Jan. 13, 2025

(65) Prior Publication Data

US 2026/0095185 A1 Apr. 2, 2026

(51) Int. Cl.
*H03L 7/081* (2006.01)
*H02M 3/157* (2006.01)
(Continued)

(52) U.S. Cl.
CPC ............. *H03L 7/0812* (2013.01); *H03K 7/08* (2013.01); *H03L 7/087* (2013.01); *H02M 3/157* (2013.01)

(58) Field of Classification Search
CPC ......... H03L 7/0812; H03L 7/087; H03K 7/08; H02M 3/157; H02M 1/0012
See application file for complete search history.

(56) References Cited

U.S. PATENT DOCUMENTS 7,570,037 B2 8/2009 Li et al.
2003/0197536 A1* 10/2003 Issa .......................... H03L 7/16 327/158
(Continued)

FOREIGN PATENT DOCUMENTS

WO WO 2010/059938 A1 5/2010

OTHER PUBLICATIONS

Huang et al., "A 4-MHz Digitally Controlled Voltage-Mode Buck Converter with Embedded Transient Improvement Using Delay Line Control Techniques", IEEE Transactions on Circuits and Systems—I: Regular Papers, vol. 67, No. 11, Nov. 2020, pp. 4029-4040.
(Continued)

*Primary Examiner* — Regis J Betsch
*Assistant Examiner* — Amit R Bhatia
(74) *Attorney, Agent, or Firm* — Birch, Stewart, Kolasch & Birch, LLP

(57) ABSTRACT

A multi-phase dual-edge digital pulse width modulation device includes a delay locked loop, a delay locked loop logic circuit, and at least one digital pulse width modulation logic circuit. The delay locked loop receives an input clock signal and thereby sequentially generates first delayed clock signals and a second delayed clock signal. All first delayed clock signals are alternately divided into a first group and a second group. The delay locked loop generates a synchronous clock signal, first synchronous delayed clock signals, and second synchronous delayed clock signals and transmits them to the digital pulse width modulation logic circuit to generates a pulse width modulation signal in response to a control digital code. The time occupied by the high voltage level of the pulse width modulation signal is positively correlated with the value of the control digital code.

10 Claims, 14 Drawing Sheets

(51) Int. Cl.
*H03K 7/08* (2006.01)
*H03L 7/087* (2006.01)

(56) References Cited

U.S. PATENT DOCUMENTS

| | | | | |
|---|---|---|---|---|
| 2014/0266136 | A1* | 9/2014 | Krishnamurthy ..... | H02M 3/155 332/110 |
| 2016/0118967 | A1 | 4/2016 | Krishnamurthy et al. | |

OTHER PUBLICATIONS

Morales et al., "Low Power 18-Bit PWM With 41 ps Resolution in 130-nm CMOS", IEEE Transactions on Circuits and Systems—II: Express Briefs, vol. 69, No. 3, Mar. 2022, pp. 1597-1601.
Urkin et al., "Digital Multiphase PWM Integrated Module Generated from a Single Synchronization Source", 2021 IEEE Applied Power Electronics Conference and Exposition (APEC), 2021, pp. 1001-1007.

* cited by examiner

MULTI-PHASE DUAL-EDGE DIGITAL PULSE WIDTH MODULATION DEVICE

BACKGROUND OF THE INVENTION

This application claims priority for the TW patent application No. 113137363 filed on 30 Sep. 2024, the content of which is incorporated by reference in its entirely.

FIELD OF THE INVENTION

The present invention relates to a pulse width modulation device, particularly to a multi-phase dual-edge digital pulse width modulation device.

DESCRIPTION OF THE RELATED ART

As digital control has the advantages of optimizing speed and area, and reducing the impact of process, voltage, temperature (PVT) and fabrication process, digital control has gradually become a popular research and application direction today. In order to cooperate with digital control circuits of high time resolution and high precision, the demand for digital pulse width modulation (DPWM) circuits with higher time resolution and higher precision is constantly increasing.

There are three common types of digital pulse width modulation circuits that include counter-based digital pulse width modulation circuits, delay line-based digital pulse width modulation circuits, and hybrid-based. digital pulse width modulation circuit. Since hybrid digital pulse width modulation circuits have the advantages of high linearity of counter-based digital pulse width modulation circuits and high resolution of delay line-based digital pulse width modulation circuits, the hybrid digital pulse width modulation circuits are more commonly used in systems compared with counter-based digital pulse-width modulation circuits and delay line-based digital pulse-width modulation circuits. The conventional hybrid digital pulse width modulation circuit is an open loop and the output pulse width may not strictly increase. The linearity of the pulse width is easily affected by PVT and the delay line is composed of multiple delay units. If one intends to increase the resolution by $2^m$ times, one often needs to add $2^m$ delay units, where m is a positive integer. Therefore, the area and power consumption of the delay line have grown exponentially, thereby causing more serious jitter problems.

To overcome the abovementioned problems, the present invention provides a multi-phase dual-edge digital pulse width modulation device, so as to solve the afore-mentioned problems of the prior art.

SUMMARY OF THE INVENTION

The present invention provides a multi-phase dual-edge digital pulse width modulation device, which reduces the complexity of digital circuits, maintains system stability, reduces the area and power consumption of a delay line by more than half, improves resolution and linearity, and shortens the startup time required for the delay line.

In an embodiment of the present invention, a multi-phase dual-edge digital pulse width modulation device includes a delay locked loop, a delay locked loop logic circuit, and at least one digital pulse width modulation logic circuit. The delay locked loop is configured to receive an input clock signal and sequentially generate $2^n$ first delayed clock signals and a second delayed clock signal based on the input clock signal, wherein n is a positive integer greater than 1. There is a fixed phase difference between adjacent two of the first delayed clock signals. There is the fixed phase difference between the second delayed clock signal and the last one of the first delayed clock signals adjacent thereto. All of the first delayed clock signals are divided into a first group and a second group. The first delayed clock signals in the first group and the first delayed clock signals in the second group alternately occur in a time axis. The delay locked loop is configured to blend phases of the input clock signal and the first delayed clock signals in the first group to generate a synchronous clock signal, first synchronous delayed clock signals, and second synchronous delayed clock signals. The first synchronous delayed clock signals and the second synchronous delayed clock signals alternately occur in the time axis. The earliest one and the latest one of the first synchronous delayed clock signals and the second synchronous delayed clock signals are respectively the first one of the second synchronous delayed clock signals and the last one of the first synchronous delayed clock signals. The phases of the first delayed clock signals in the first groups are respectively offset from phases of the first synchronous delayed clock signals by a fixed difference. The phase of the synchronous clock signal is offset from the phase of the input clock signal by the fixed difference. The phases of the second synchronous delayed clock signals are respectively offset from phases of the inverted ones of the first delayed clock signals by the fixed difference. The phase of the synchronous clock signal leads the phase of the first one of the second synchronous delayed clock signals. The inverted phase of the last one of the first synchronous delayed clock signals leads the phase of the synchronous clock signal. The delay locked loop logic circuit is coupled to the delay locked loop and configured to receive at least two input respective enabling signals, the input clock signal, the last one of the first delayed clock signals, and the second delayed clock signal, thereby adjusting the fixed phase difference. The digital pulse width modulation logic circuit is coupled to the delay locked loop and the delay locked loop logic circuit and configured to receive one of the at least two input respective enabling signals, a power-on reset (POR) signal, an input digital code, the synchronous clock signal, the first delayed clock signals, and the second delayed clock signals, thereby generating a pulse width modulation signal. The pulse width of the pulse width modulation signal is positively correlated with the value of the control digital code.

In an embodiment of the present invention, the delay locked loop includes a first variable current source, a second variable current source, a delay line, and a phase blending circuit. The first variable current source and the second variable current source are respectively coupled to a high voltage and a low voltage and coupled to the delay locked loop logic circuit. The delay locked loop logic circuit is configured to control the first variable current source and the second variable current source to generate a variable current. The delay line is coupled between the first variable current source and the second variable current source and coupled to the delay locked loop logic circuit. The delay line is configured to receive the variable current and the input clock signal and sequentially generate the $2^n$ first delayed clock signals and the second delayed clock signal based on the input clock signal and the variable current. The phase blending circuit is coupled to the delay line and the digital pulse width modulation logic circuit and configured to receive the input clock signal and the first delayed clock signals in the first group and blend the phase of the input clock signal and the phases of the first delayed clock signals in the first group to generate the synchronous clock signal, the first synchronous delayed clock signals, and the second synchronous delayed clock signals.

In an embodiment of the present invention, the delay line includes $2^n+2$ inverters coupled in series.

In an embodiment of the present invention, the delay line includes 34 inverters coupled in series.

In an embodiment of the present invention, the delay locked loop further includes $2^n$ first buffers and a second buffer and the $2^n$ first buffers and the second buffer are coupled between the phase blending circuit and the digital pulse width modulation logic circuit.

In an embodiment of the present invention, the delay locked loop logic circuit includes an OR gate, a phase detecting and setting circuit, an inverter, a first phase detector, a second phase detector, and a control counter. The OR gate is configured to receive the input respective enabling signals, thereby generating an output respective enabling signal. The phase detecting and setting circuit is coupled to the OR gate and configured to receive the input clock signal, the POR signal, and the output respective enabling signal. When the POR signal and the output respective enabling signal are high-level voltages, the phase detecting and setting circuit temporarily generates a set signal. The inverter is configured to receive and invert the input clock signal to generate the inverted input clock signal. The first phase detector is coupled to the phase detecting and setting circuit, the inverter, and the delay line and configured to receive the set signal, the inverted input clock signal, and the last one of the first delayed clock signals to detect a first phase difference between the inverted input clock signal and the last one of the first delayed clock signals. The second phase detector is coupled to the phase detecting and setting circuit and the delay line and configured to receive the set signal, the last one of the first delayed clock signals, and the second delayed clock signal to detect a second phase difference between the last one of the first delayed clock signals and the second delayed clock signal. The control counter is coupled to the first phase detector, the second phase detector, the first variable current source, and the second variable current source and configured to receive the first phase difference and the second phase difference. When the phase of the second delayed clock signal lags the phase of the inverted input clock signal and the phase of the inverted input clock signal lags the phase of the last one of the first delayed clock signals, the control counter keeps the variable current and the fixed phase difference unchanged. When the phase of the second delayed clock signal lags the phase of the last one of the first delayed clock signals and the phase of the inverted input clock signal lags the phase of the second delayed clock signal, the control counter decreases the variable current to increase the fixed phase difference. When the phase of the last one of the first delayed clock signals lags the phase of the inverted input clock signal and the phase of the second delayed clock signal lags the phase of the last one of the first delayed clock signals, the control counter increases the variable current to decrease the fixed phase difference.

In an embodiment of the present invention, the input digital code includes a first byte, a dual-edge selection bit, and a second byte. The digital pulse width modulation logic circuit includes a first multiplexer, an edge selector, a first D flip-flop, a second D flip-flop, a first counter, a first comparator, a third D flip-flop, a delayer, a fourth D flip-flop, a second multiplexer, a fifth D flip-flop, an AND gate, a second counter, a second comparator, and a SR latch. The inputs of the first multiplexer are coupled to the $2^n$ first buffers and configured to receive the first synchronous delayed clock signals and the second synchronous delayed clock signals. The control terminal of the first multiplexer is configured to receive the first byte. The first multiplexer is configured to select one of the first synchronous delayed clock signals and the second synchronous delayed clock signals as a delayed output signal based on the value of the first byte. The edge selector is coupled to the output of the first multiplexer and configured to receive the dual-edge selection bit and the delayed output signal and keep or invert the phase of the delayed output signal based on the value of the dual-edge selection bit to output the delayed output signal with an original phase or the inverted delayed output signal. The D input of the first D flip-flop is coupled to a supply voltage. The clock input of the second D flip-flop is coupled to the second buffer and the synchronous clock signal. The D input of the second D flip-flop is coupled to the Q output of the first D flip-flop. The input of the first counter is coupled to the second buffer and the synchronous clock signal. The setting terminal of the first counter is coupled to the Q output of the second D flip-flop. The negative terminal of the first comparator is coupled to the output of the first counter. The positive terminal of the first comparator is configured to receive the second byte. The D input of the third D flip-flop is coupled to an output of the first comparator. The clock input of the third D flip-flop is coupled to the second buffer and the synchronous clock signal. The delayer is coupled to the Q output of the third D flip-flop. The phase delay of a signal caused by the delayer is equal to the phase delay of a signal caused by the first multiplexer and the edge selector. The D input of the fourth D flip-flop is coupled to the delayer. The clock input of the fourth D flip-flop is coupled to the edge selector. The input of the second multiplexer is coupled to the Q output of the fourth D flip-flop and the supply voltage. The control terminal of the second multiplexer is coupled to the POR signal. The D input of the fifth D flip-flop is coupled to the supply voltage. The clock input of the fifth D flip-flop is coupled to the delay locked loop logic circuit and one of the input respective enabling signals. The inputs of the AND gate are coupled to the second buffer, the Q output of the fifth D flip-flop, and the synchronous clock signal. The positive terminal of the second comparator is coupled to the output of the second counter. The S input of the SR latch is coupled to the output of the second comparator. The R input of the SR latch is coupled to the output of the second multiplexer and configured to output the pulse width modulation signal.

In an embodiment of the present invention, the first byte has n bits.

In an embodiment of the present invention, the input digital code has 14 bits.

In an embodiment of the present invention, the at least one digital pulse width modulation logic circuit includes a plurality of digital pulse width modulation logic circuits that are respectively configured to receive the at least two input respective enabling signals.

To sum up, the multi-phase dual-edge digital pulse width modulation device employs closed-loop feedback control to reduce the complexity of digital circuits and maintain system stability and employs a dual-edge inverted delay line to reduce the area and power consumption of a delay line by more than half, improve resolution and linearity, and shorten the startup time required for the delay line.

Below, the embodiments are described in detail in cooperation with the drawings to make easily understood the technical contents, characteristics and accomplishments of the present invention.

DETAILED DESCRIPTION OF THE INVENTION

Figure 1A:
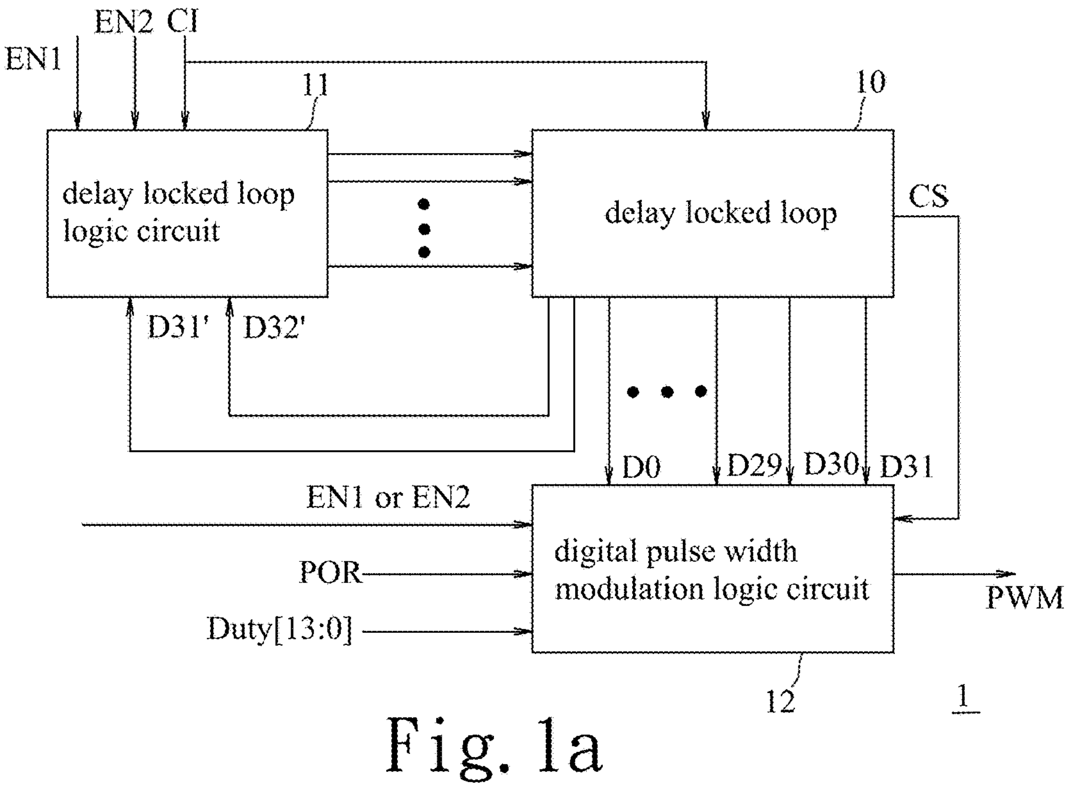
FIG. 1*a* is a schematic diagram illustrating a multi-phase dual-edge digital pulse width modulation device according to an embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

When an element is referred to as being “on” another element, it can be directly on the other element or intervening elements may be present therebetween. In contrast, when an element is referred to as being “directly on” another element, there are no intervening elements present. As used herein, the term “and/or” includes any and all combinations of one or more of the associated listed items.

Reference throughout this specification to “one embodiment” or “an embodiment” means that a particular feature, structure, or characteristic described in connection with the embodiment is included in at least one embodiment. Thus, the appearances of the phrases “in one embodiment” or “in an embodiment” in various places throughout this specification are not necessarily all referring to the same embodiment.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles “a” and “the” includes the meaning of “one or at least one” of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article “wherein” includes the meaning of the articles “wherein” and “whereon”. The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

Furthermore, it can be understood that the terms “comprising,” “including,” “having,” “containing,” and “involving” are open-ended terms, which refer to “may include but is not limited to so.” In addition, each of the embodiments or claims of the present invention is not necessary to achieve all the effects and advantages possibly to be generated, and the abstract and title of the present invention is used to assist for patent search and is not used to further limit the claimed scope of the present invention.

Further, in the present specification and claims, the term "comprising" is open type and should not be viewed as the term "consisted of." In addition, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means. Moreover, when the transmissions or generations of electrical signals are mentioned, one skilled in the art should understand some degradations or undesirable transformations could be generated during the operations. If it is not specified in the specification, an electrical signal at the transmitting end should be viewed as substantially the same signal as that at the receiving end. For example, when the end A of an electrical circuit provides an electrical signal S to the end B of the electrical circuit, the voltage of the electrical signal S may drop due to passing through the source and drain of a transistor or due to some parasitic capacitance. However, the transistor is not deliberately used to generate the effect of degrading the signal to achieve some result, that is, the signal S at the end A should be viewed as substantially the same as that at the end B.

Unless otherwise specified, some conditional sentences or words, such as "can", "could", "might", or "may", usually attempt to express what the embodiment in the present invention has, but it can also be interpreted as a feature, element, or step that may not be needed. In other embodiments, these features, elements, or steps may not be required.

In the following description, a multi-phase dual-edge digital pulse width modulation device will be provided, which employs closed-loop feedback control to reduce the complexity of digital circuits and maintain system stability and employs a dual-edge inverted delay line to reduce the area and power consumption of a delay line by more than half, improve resolution and linearity, and shorten the startup time required for the delay line.

FIG. 1*a* is a schematic diagram illustrating a multi-phase dual-edge digital pulse width modulation device according to an embodiment of the present invention. Referring to FIG. 1*a*, a multi-phase dual-edge digital pulse width modulation device 1 that employs a closed loop feedback control mechanism will be introduced as follows. The multi-phase dual-edge digital pulse width modulation device 1 includes a delay locked loop 10, a delay locked loop logic circuit 11, and at least one digital pulse width modulation logic circuit 12. For convenience and clarity, the number of the digital pulse width modulation logic circuit 12 is one. The delay locked loop logic circuit 11 is coupled to the delay locked loop 10. The digital pulse width modulation logic circuit 12 is coupled to the delay locked loop 10 and the delay locked loop logic circuit 11.

Figure 1B:
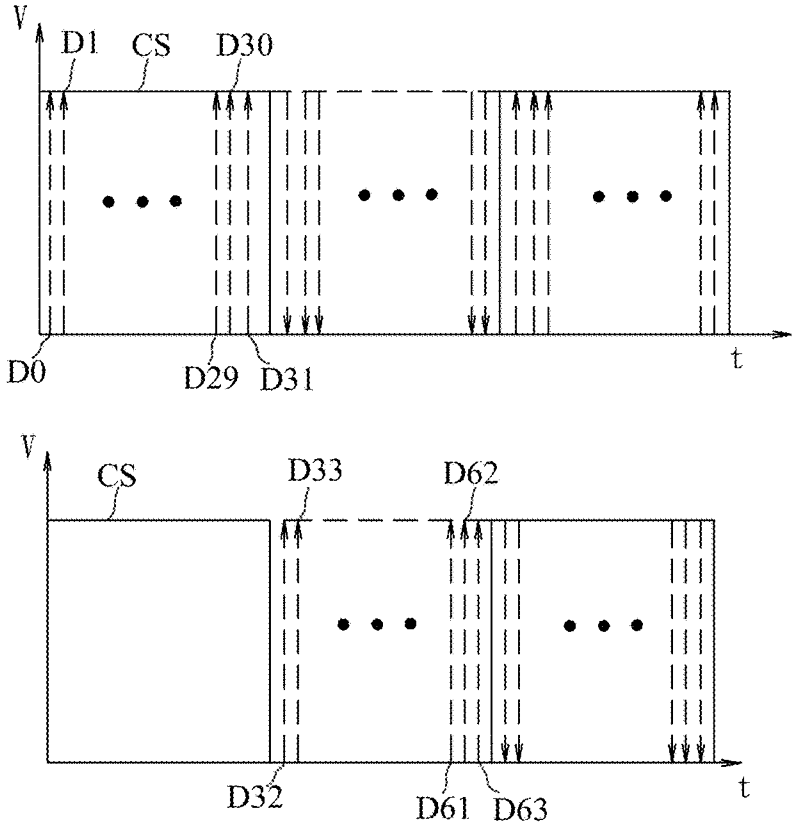
FIG. 1*b* is a schematic diagram illustrating the waveforms of an input clock signal and delayed clock signals according to an embodiment of the present invention.

FIG. 1*b* is a schematic diagram illustrating the waveforms of an input clock signal and delayed clock signals according to an embodiment of the present invention. Please refer to FIG. 1*a* and FIG. 1*b*. For example, the delay locked loop 10 employs a delay line with a resolution of 6 bits. The delay locked loop 10 receives and delays an input clock signal CI to generate a synchronous clock signal CS, first synchronous delayed clock signals D1, D3, . . . , and D31, second synchronous delayed clock signals D0, D2, . . . , and D30, and synchronous delayed clock signals D32~D63. In the positive semi-cycle of the synchronous clock signal CS, the delay locked loop 10 generates the first synchronous delayed clock signals D1, D3, . . . , and D31 and the second synchronous delayed clock signals D0, D2, . . . , and D30. In the negative semi-cycle of the synchronous clock signal CS, the delay locked loop 10 generates the synchronous delayed clock signals D32~D63. However, the synchronous delayed clock signals D32~D63 are respectively the inverted synchronous delayed clock signals D0~D31. As a result, the resolution of 6 bits is successfully achieved as long as the delay locked loop 10 generates the synchronous delayed clock signals D0~D31. In FIG. 1*a*, the delay locked loop 10 sequentially generates $2^n$ first delayed clock signals and a second delayed clock signal based on the input clock signal CI, where n is a positive integer greater than 1. In the embodiment, n is 5. There is a fixed phase difference between adjacent two of the first delayed clock signals. There is the fixed phase difference between the second delayed clock signal and the last one of the first delayed clock signals adjacent thereto. For the convenience of explanation, the first delayed clock signals that are sequentially generated are respectively represented with D0'~D31' and the second delayed clock signal is represented with D32'. All of the first delayed clock signals D0'~D31' are divided into a first group and a second group. The first delayed clock signals D0', D2', . . . , and D30' in the second group and the first delayed clock signals D1', D3', . . . , and D31' in the first group alternately occur in a time axis. The delay locked loop 10 blends the phases of the input clock signal CI and the first delayed clock signals D1', D3', . . . , and D31' in the first group to generate the synchronous clock signal CS, the first synchronous delayed clock signals D1, D3, . . . , and D31, and the second synchronous delayed clock signals D0, D2, . . . , and D30. The first synchronous delayed clock signals D1, D3, . . . , and D31 and the second synchronous delayed clock signals D0, D2, . . . , and D30 alternately occur in the time axis. The earliest one and the latest one of the first synchronous delayed clock signals D1, D3, . . . , and D31 and the second synchronous delayed clock signals D0, D2, . . . , and D30 are respectively the first one D0 of the second synchronous delayed clock signals and the last one D31 of the first synchronous delayed clock signals. The phases of the first delayed clock signals D1', D3', . . . , and D31' in the first groups are respectively offset from the phases of the first synchronous delayed clock signals D1, D3, . . . , and D31 by a fixed difference. The phase of the synchronous clock signal CS is offset from the phase of the input clock signal CI by the fixed difference. The phases of the second synchronous delayed clock signals D0, D2, . . . , and D30 are respectively offset from the phases of inverted ones $\overline{D0'}$, $\overline{D2'}$, . . . , and $\overline{D30'}$ of the first delayed clock signals by the fixed difference. In order to ensure that the different phases of the signals match time, the phase of the synchronous clock signal CS is set to lead the phase of the first one D0 of the second synchronous delayed clock signals and the inverted phase of the last one D31 of the first synchronous delayed clock signals is set to lead the phase of the synchronous clock signal CS. That is to say, the inverted phase of the first synchronous delayed clock signal D31 is the phase off the synchronous delayed clock signal D63.

The delay locked loop logic circuit 11 receives at least two input respective enabling signals EN1 and EN2, the input clock signal CI, the last one D31' of the first delayed clock signals, and the second delayed clock signal D32', thereby adjusting the fixed phase difference. The digital pulse width modulation logic circuit 12 receives one of the input respective enabling signals EN1 and EN2, a power-on reset (POR) signal POR, an input digital code Duty[13:0], the synchronous clock signal CS, the first delayed clock signals D1, D3, . . . , and D31, and the second delayed clock signals D0, D2, . . . , and D30, thereby generating a pulse width modulation signal PWM. The pulse width of the pulse width modulation signal PWM is positively correlated with the value of the control digital code Duty[13:0]. In the embodiment, the input digital code Duty[13:0] has 14 bits. The pulse width represents the time of a high-level voltage in each cycle of the pulse width modulation signal PWM.

Figure 2A:
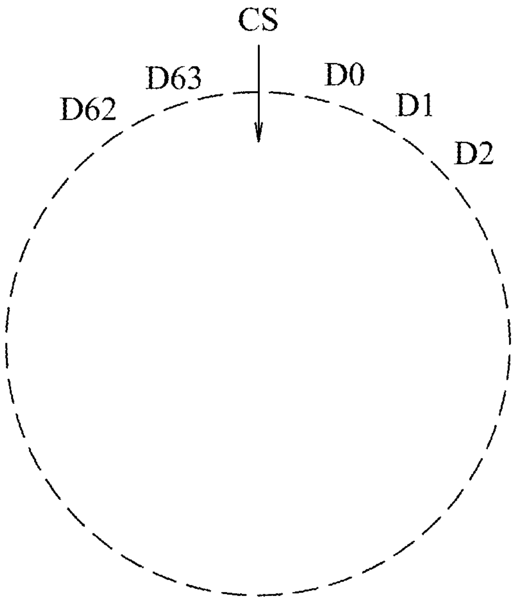
FIG. 2*a* is a schematic diagram illustrating the phase relationships of a synchronous clock signal and delayed clock signals according to an embodiment of the present invention.
Figure 2B:
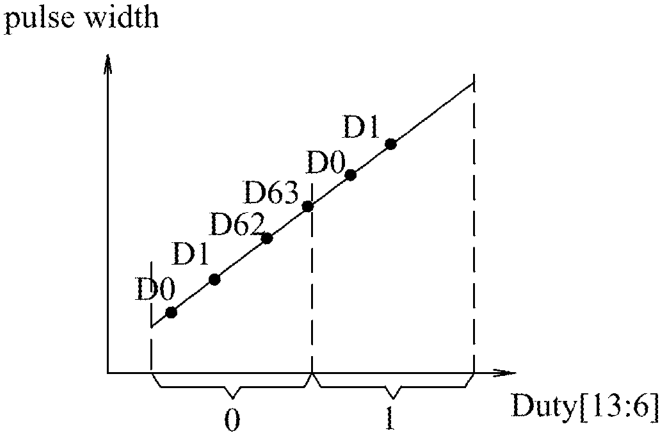
FIG. 2*b* is a schematic diagram illustrating a curve of a pulse width to an input digital code according to an embodiment of the present invention.

FIG. 2*a* is a schematic diagram illustrating the phase relationships of a synchronous clock signal and delayed clock signals according to an embodiment of the present invention. FIG. 2*b* is a schematic diagram illustrating a curve of a pulse width to an input digital code according to an embodiment of the present invention. Please refer to FIG. 2*a* and FIG. 2*b*. During the signal transmission process of the delay line, the output pulse width may not increase with the increase of the value of the input digital code Duty[13:0] due to the mismatch of the transmission paths. In order to avoid this problem, the phase of the synchronous clock signal CS is set to lead the phase of the synchronous delayed clock signal D0 and the phase of the synchronous delayed clock signal D63 is set to lead the phase of the synchronous clock signal CS. Duty[13:6] in FIG. 2*b* represents the value of the 7th to 14th bits of the input digital code Duty[13:0]. The "0" on the horizontal axis in FIG. 2*b* represents the first cycle of the input clock signal and the "1" on the horizontal axis in FIG. 2*b* represents the second cycle of the input clock signal.

Figure 3A:
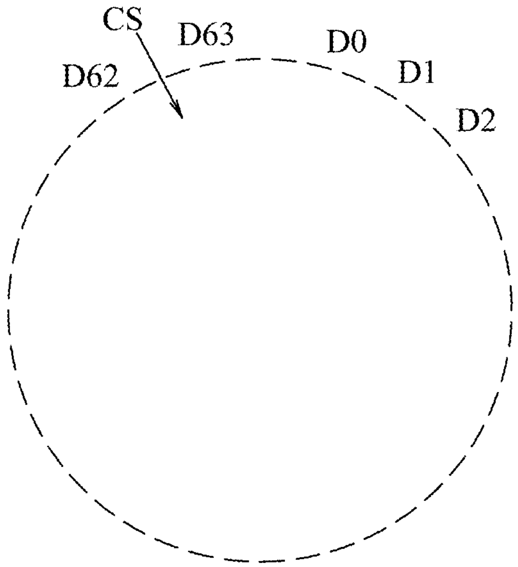
FIG. 3*a* is a schematic diagram illustrating the phase relationships of a synchronous clock signal with a leading phase and synchronous delayed clock signals according to an embodiment of the present invention.
Figure 3B:
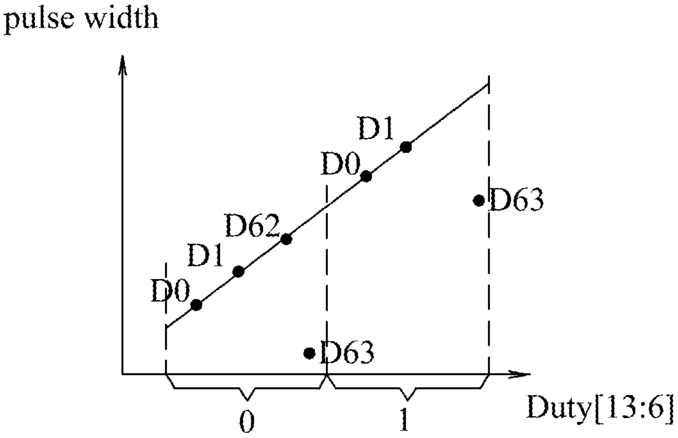
FIG. 3*b* is a schematic diagram illustrating a curve of a pulse width to an input digital code corresponding to FIG. 3*a;*

FIG. 3*a* is a schematic diagram illustrating the phase relationships of a synchronous clock signal with a leading phase and synchronous delayed clock signals according to an embodiment of the present invention. FIG. 3*b* is a schematic diagram illustrating a curve of a pulse width to an input digital code corresponding to FIG. 3*a*. Please refer to FIG. 3*a* and FIG. 3*b*. When the phase of the synchronous clock signal CS is set to lead the phases of the synchronous delayed clock signals D0 and D63, the pulse width corresponding to the synchronous delayed clock signal D63 is less than the pulse width corresponding to the synchronous delayed clock signal D0 in the same cycle based on the original setting mechanism.

Figure 4A:
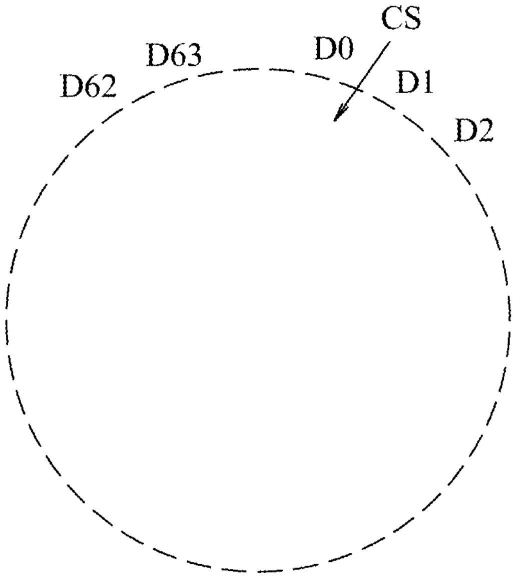
FIG. 4*a* is a schematic diagram illustrating the phase relationships of a synchronous clock signal with a lagging phase and synchronous delayed clock signals according to an embodiment of the present invention.
Figure 4B:
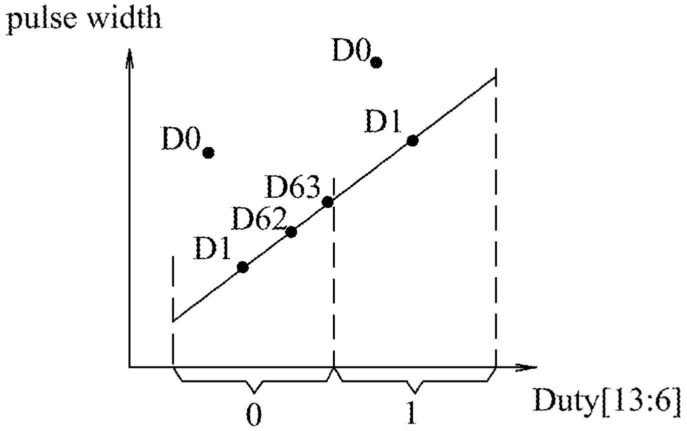
FIG. 4*b* is a schematic diagram illustrating a curve of a pulse width to an input digital code corresponding to FIG. 4*a;*

FIG. 4*a* is a schematic diagram illustrating the phase relationships of a synchronous clock signal with a lagging phase and synchronous delayed clock signals according to an embodiment of the present invention. FIG. 4*b* is a schematic diagram illustrating a curve of a pulse width to an input digital code corresponding to FIG. 4*a*. Please refer to FIG. 4*a* and FIG. 4*b*. When the phase of the synchronous clock signal CS is set to lag the phases of the synchronous delayed clock signals D0 and D63, the pulse width corresponding to the synchronous delayed clock signal D0 is greater than the pulse width corresponding to the synchronous delayed clock signal D63 in the same cycle based on the original setting mechanism.

Figure 5:
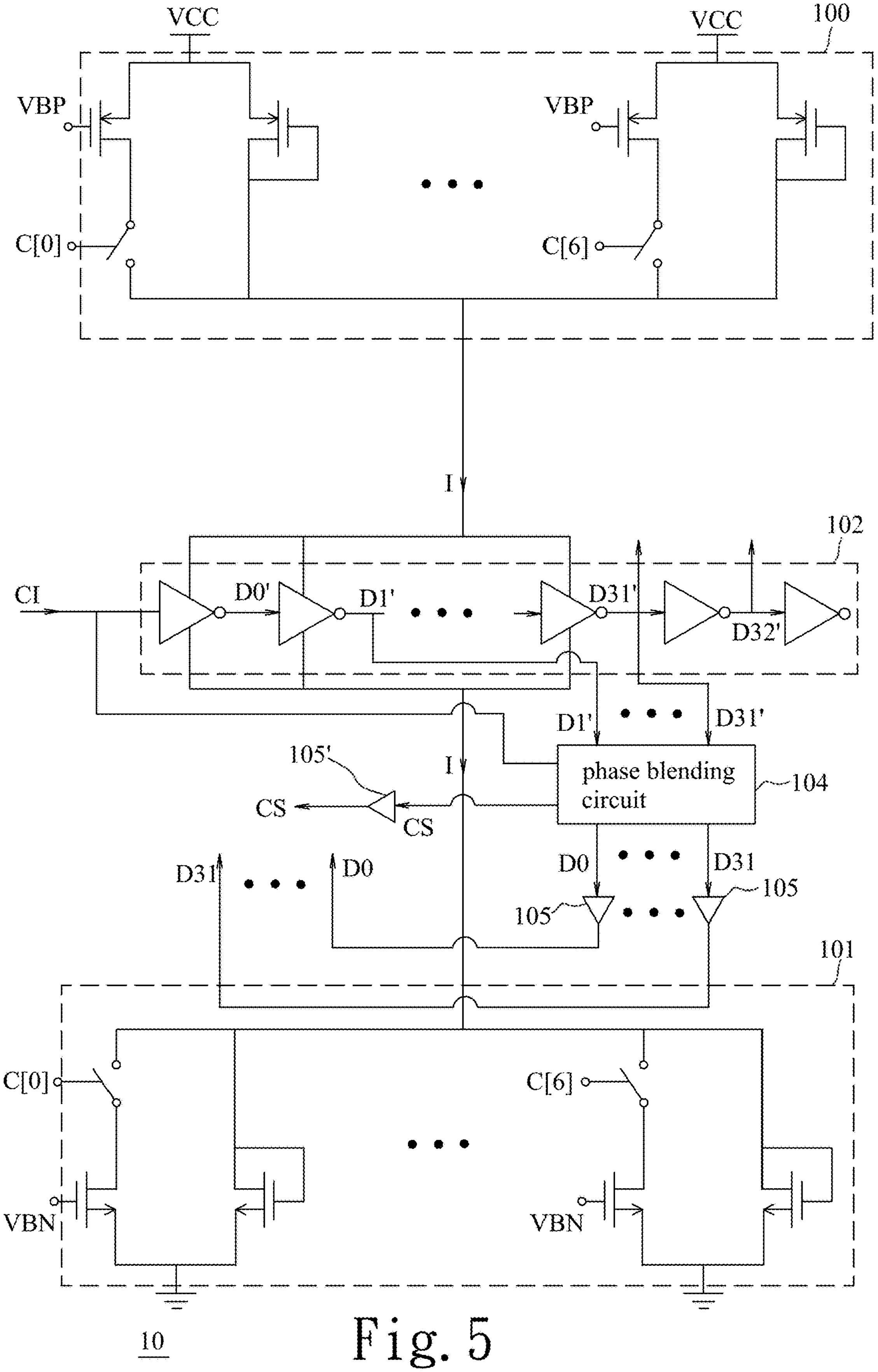
FIG. 5 is a schematic diagram illustrating a delay locked loop according to an embodiment of the present invention.

FIG. 5 is a schematic diagram illustrating a delay locked loop according to an embodiment of the present invention. Referring to FIG. 1*a* and FIG. 5, the delay locked loop 10 may include a first variable current source 100, a second variable current source 101, a delay line 102, and a phase blending circuit 104. The first variable current source 100 and the second variable current source 101 are respectively coupled to a high voltage VCC and a low voltage and coupled to the delay locked loop logic circuit 11. For example, the low voltage is a grounding voltage. The first variable current source 100 is coupled to a low voltage VBP. The second variable current source 101 is coupled to a high voltage VBN. The delay line 102 is coupled between the first variable current source 100 and the second variable current source 101 and coupled to the delay locked loop logic circuit 11. The delay line 102 may include $2^n$+2 inverters coupled in series, but the present invention is not limited thereto. Specifically, the delay line 102 includes 34 inverters coupled in series. The phase blending circuit 104 is coupled to the delay line 102 and the digital pulse width modulation logic circuit 12.

The delay locked loop logic circuit 11 generates control signals C[0]~C[6] to control the first variable current source 100 and the second variable current source 101 to generate a variable current I. The delay line 102 receives the variable current I and the input clock signal CI and sequentially generates the $2^n$ first delayed clock signals D0'~D31' and the second delayed clock signal D32' based on the input clock signal CI and the variable current I. The variable current I is used to adjust the fixed phase differences among the first delayed clock signals D0', D1', D2', . . . , and D31' and the second delayed clock signal D32'. When the variable current I is greater, the startup time of the delay line 102 is shorter. In order to synchronize the input clock signal CI with the first delayed clock signals D1', D3', . . . , and D31' in the first group, the input clock signal CI and the first delayed clock signals D1', D3', . . . , and D31' in the first group are transmitted to the phase blending circuit 104. The phase blending circuit 104 receives the input clock signal CI and the first delayed clock signals D1', D3', . . . , and D31' in the first group and blends the phase of the input clock signal CI and the phases of the first delayed clock signals D1', D3', . . . , and D31' in the first group to generate the synchronous clock signal CS, the first synchronous delayed clock signals D1, D3, . . . , and D31, and the second synchronous delayed clock signals D0, D2, . . . , and D30. Besides, in some embodiments, the delay locked loop 10 further includes $2^n$ first buffers 105 and a second buffer 105'. The first buffers 105 and the second buffer 105' are coupled between the phase blending circuit 104 and the digital pulse width modulation logic circuit 12. The first buffers 105 receive the synchronous delayed clock signals D0~D31 and transmits the synchronous delayed clock signals D0~D31 to the digital pulse width modulation logic circuit 12. The second buffer 105' receives the synchronous clock signal CS and transmits the synchronous clock signal CS to the digital pulse width modulation logic circuit 12.

In order to achieve higher time resolution and save area, the delay line 102 is implemented with a dual-edge inverted-phase delay line instead of a single-edge in-phase delay line. Delay lines are composed of multiple inverters coupled in series. The dual-edge inverted-phase delay line uses each inverter as a delay unit and provides the signal output by each delay unit to the post-stage architecture for use. The single-edge in-phase delay line uses two adjacent inverters as a delay unit and provides the signal output by each delay unit to the post-stage architecture for use. If the dual-edge inverted-phase delay line and the single-edge in-phase delay line use the same number of inverters, the number of signals output by the single-edge in-phase delay line is ¼ of the number of signals output by the dual-edge inverted-phase delay line.

For example, if a delay line with a resolution of 3 bits is required, the single-edge in-phase delay line requires $2^3$=8 delay units that are equivalent to 16 inverters. The dual-edge inverted-phase delay line only requires $2^2$=4 delay units that are equivalent to 4 inverters. It can be seen that the area of the dual-edge inverted-phase delay line is ¼ of the single-edge in-phase delay line when the single-edge in-phase delay line and the dual-edge inverted-phase delay line have the same resolution. The digital pulse width modulation logic circuit of the post-stage needs to use a multiplexer to select the output signal of the required delay line. The single-edge in-phase delay line needs an 8:1 multiplexer, and the dual-edge inverted-phase delay line needs a 4:1 multiplexer and a 2:1 multiplexer. Therefore, for the post-stage architecture, the dual-edge inverted-phase delay line only needs a smaller area to extract the target delayed output signal, which can not only reduce the area but also improve the performance and have better jitter characteristics. Table 1 compares the single-edge in-phase delay line and the dual-edge inverted-phase delay line with a resolution of p bits, where p is greater than or equal to 1.

TABLE 1

| | single-edge in-phase delay line | dual-edge inverted-phase delay line |
|---|---|---|
| Number of inverters | $2^{p+1}$ | $2^{p-1}$ |
| post-stage architecture | $2^{p}$: 1 multiplexer | $2^{p-1}$: 1 multiplexer +2: 1 multiplexer |

The first delayed clock signals D1', D3', . . . , and D31' in first group and the first delayed clock signals D0', D2', . . . , and D30 in the second group outputted by the dual-edge inverted-phase delay line are easily affected by process, voltage, and temperature (PVT), resulting in different delay time. If the output signal of each delay unit of the dual-edge inverted-phase delay line is transmitted to the digital pulse width modulation logic circuit, half of the output signals will need to be inverted by an additional inverter before the output signals can trigger on other circuits. However, the delay error caused by the inverter may eliminate characteristics that the pulse width increases strictly as the value of the input digital code increases. In order to solve the foregoing problems, a phase blending circuit is used to correct the resolutions of adjacent pulses. Since the size of the phase blending circuit is much smaller than the size of the delay line, it does not affect the area and power consumption of the overall device.

Figure 6:
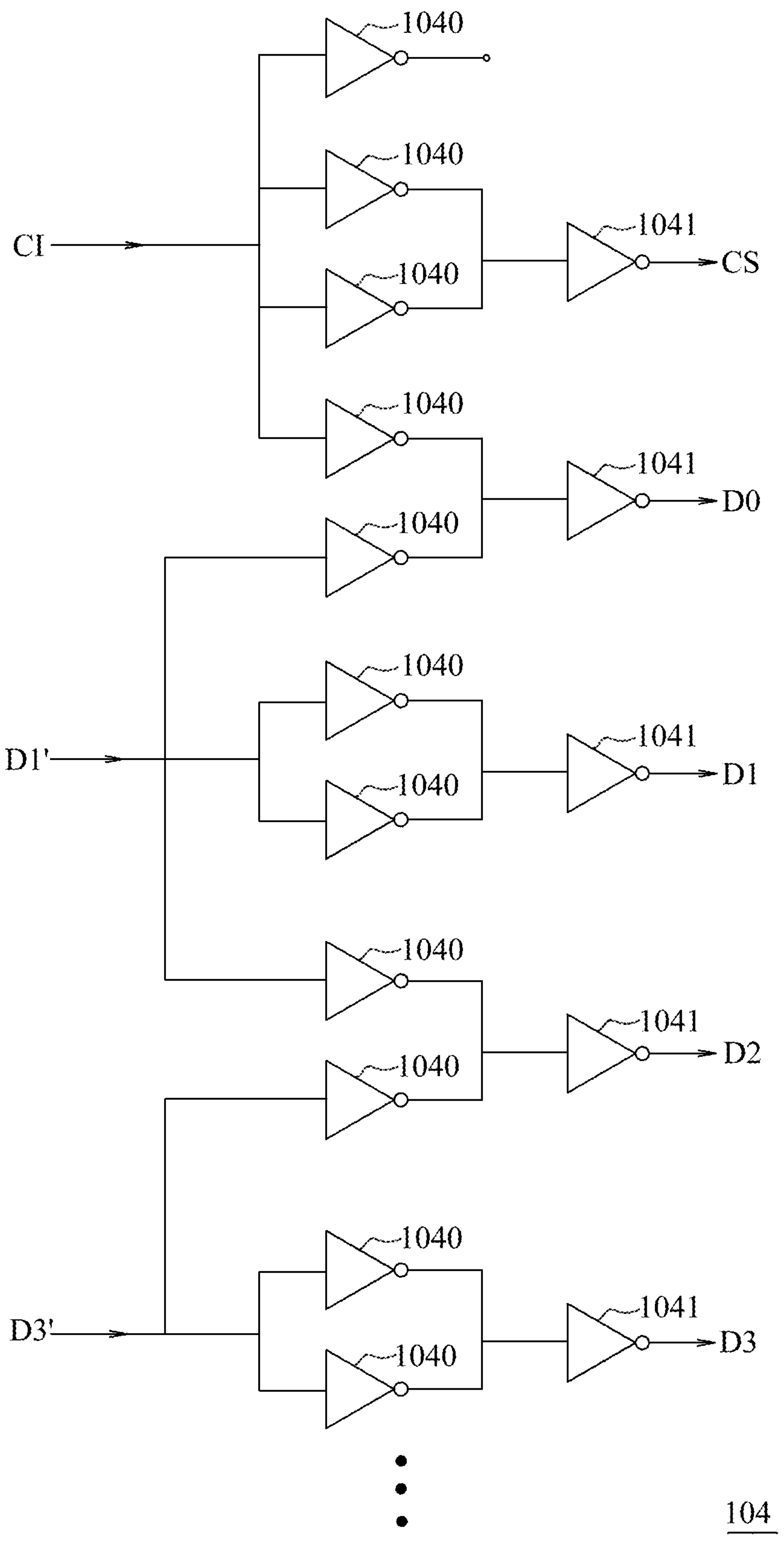
FIG. 6 is a schematic diagram illustrating a phase blending circuit according to an embodiment of the present invention.
Figure 7:
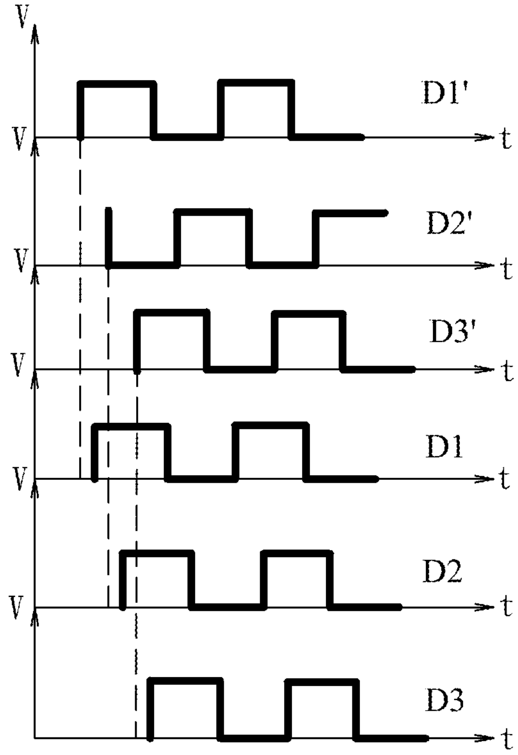
FIG. 7 is a schematic diagram illustrating the waveforms of delayed clock signals according to an embodiment of the present invention.

FIG. 6 is a schematic diagram illustrating a phase blending circuit according to an embodiment of the present invention. FIG. 7 is a schematic diagram illustrating the waveforms of delayed clock signals according to an embodiment of the present invention. Referring to FIG. 5, FIG. 6, and FIG. 7, the phase blending circuit 104 includes inverters 1040 and 1041, receives the input clock signal CI and the first delayed clock signals D1', D3', . . . , and D31' in the first group, and blend the phase of the input clock signal CI and the phases of the first delayed clock signals D1', D3', . . . , and D31' in the first group to generate the first synchronous delayed clock signals D1, D3, . . . , and D31 and the second synchronous delayed clock signals D0, D2, . . . , and D30. Compared with the first delayed clock signals D0'~D31', the first synchronous delayed clock signals D1, D3, . . . , and D31 and the second synchronous delayed clock signals D0, D2, . . . , and D30 have higher linearity and eliminate the non-linear problem of delayed output signals. The delay locked loop 10 uses the dual-edge inverted-phase delay line and the phase blending circuit 104, which can reduce the area and power consumption by 75% compared to the single-edge in-phase delay line, and have better linearity and resolution.

Figure 8:
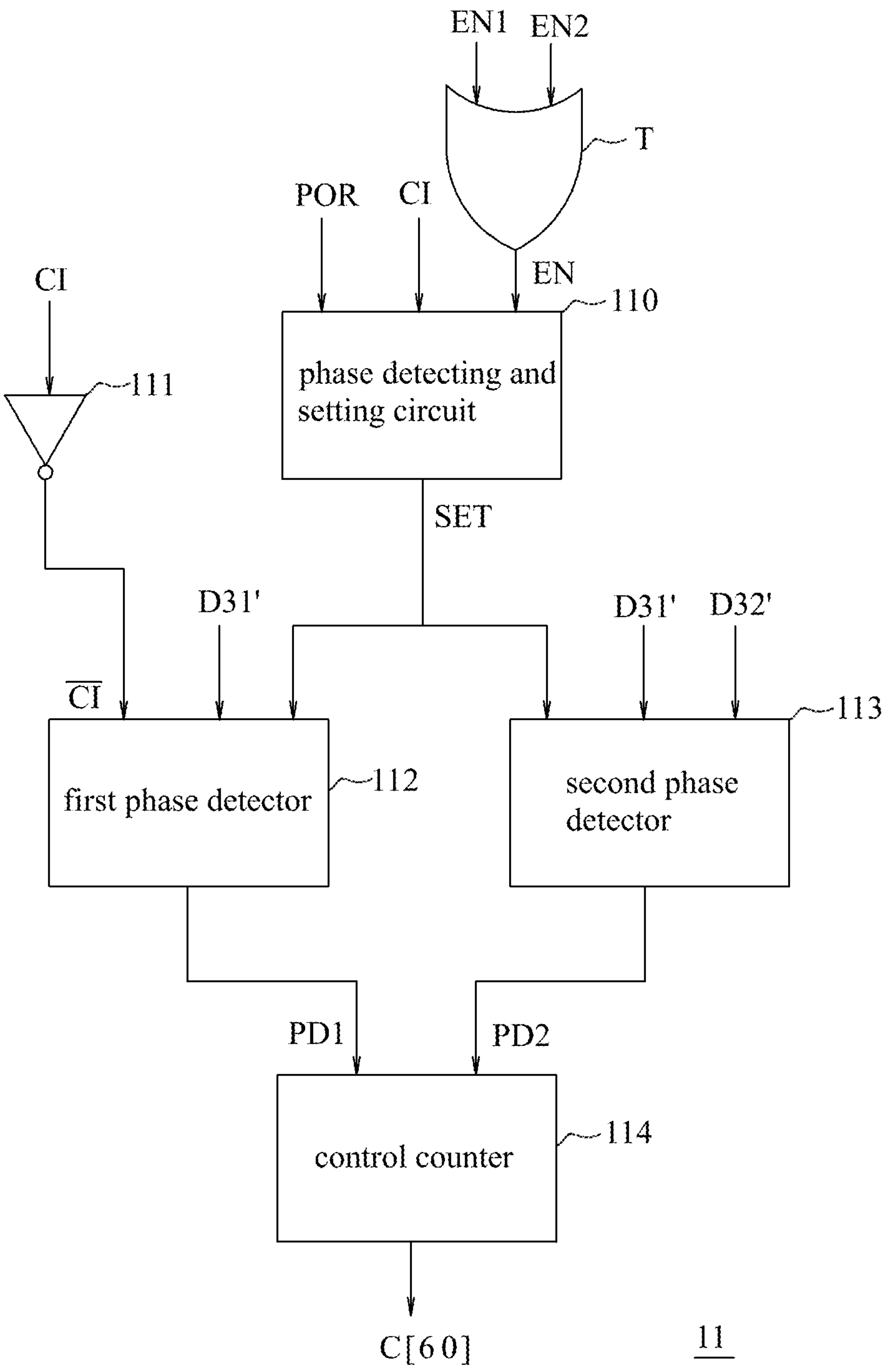
FIG. 8 is a schematic diagram illustrating a delay locked loop logic circuit according to an embodiment of the present invention.
Figure 9:
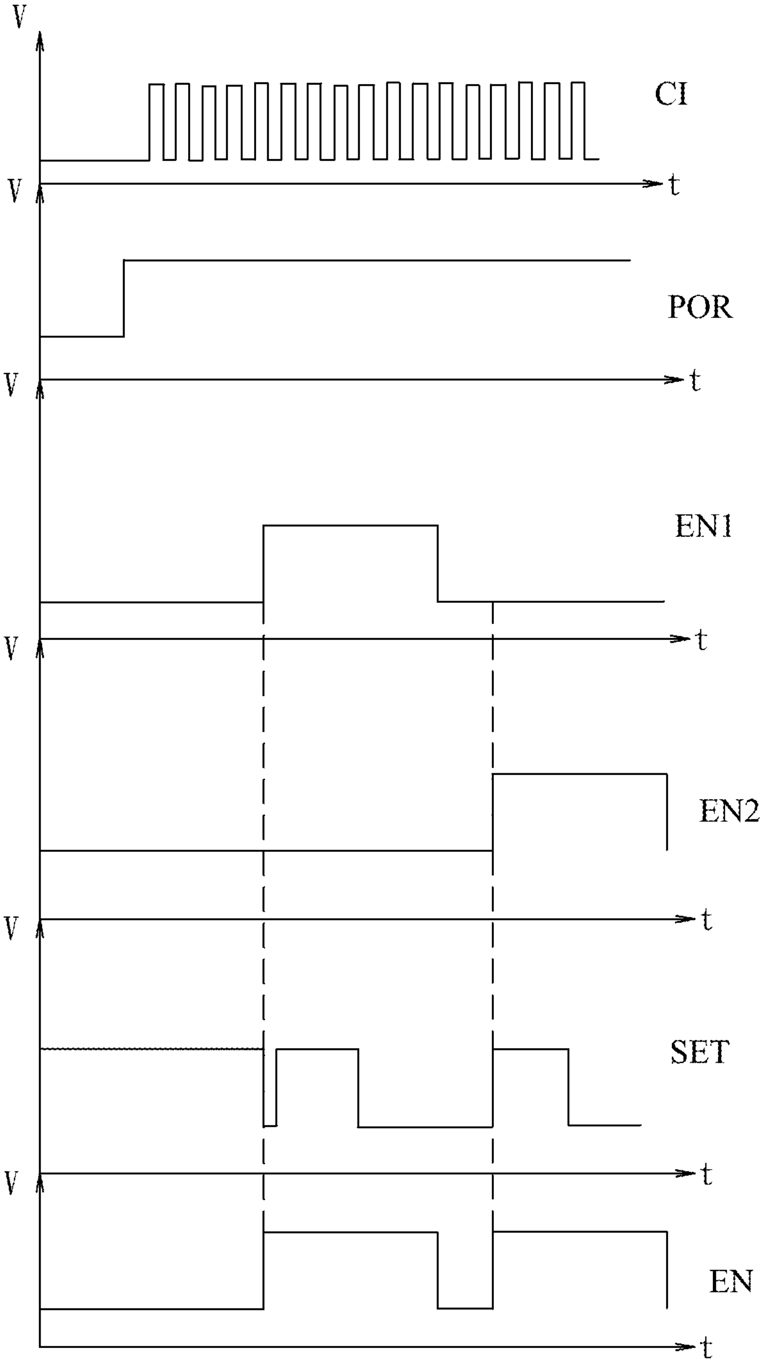
FIG. 9 is a schematic diagram illustrating the waveforms of an input clock signal, respective enabling signals, a power-on reset (POR) signal, and a set signal according to an embodiment of the present invention.

FIG. 8 is a schematic diagram illustrating a delay locked loop logic circuit according to an embodiment of the present invention. FIG. 9 is a schematic diagram illustrating the waveforms of an input clock signal, respective enabling signals, a power-on reset (POR) signal, and a set signal according to an embodiment of the present invention. Referring to FIG. 5, FIG. 8, and FIG. 9, the delay locked loop logic circuit may include an OR gate T, a phase detecting and setting circuit 110, an inverter 111, a first phase detector 112, a second phase detector 113, and a control counter 114. The OR gate T is coupled to the phase detecting and setting circuit 110. The first phase detector 112 is coupled to the phase detecting and setting circuit 110, the inverter 111, and the delay line 102. The second phase detector 113 is coupled to the phase detecting and setting circuit 110 and the delay line 102. The control counter 114 is coupled to the first phase detector 112, the second phase detector 113, the first variable current source 100, and the second variable current source 101. The OR gate T receives the input respective enabling signals EN1 and EN2, thereby generating an output respective enabling signal EN. When the POR signal POR and the output respective enabling signal EN are high-level voltages, the phase detecting and setting circuit 110 temporarily generates a set signal SET. The inverter 111 receives and inverts the input clock signal CI to generate the inverted input clock signal CI. The first phase detector 112 receives the set signal SET, the inverted input clock signal CI, and the last one D31' of the first delayed clock signals to detect a first phase difference PD1 between the inverted input clock signal CI and the last one D31' of the first delayed clock signals. The second phase detector 113 receives the set signal SET, the last one D31' of the first delayed clock signals, and the second delayed clock signal D32' to detect a second phase difference PD2 between the last one D31' of the first delayed clock signals and the second delayed clock signal D32'. The control counter 114 receives the first phase difference PD1 and the second phase difference PD2 and generates control signals C[6:0] that are equivalent to control signals C[0]~C[6] based on the first phase difference PD1 and the second phase difference PD2 to adjust the variable current I and the fixed phase differences among the first delayed clock signals D1', D2', . . . , and D31' and the first delayed clock signal D32'.

Figure 10A:
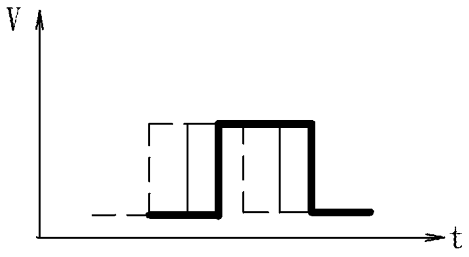
FIG. 10*a* is a schematic diagram illustrating the waveforms of a second delayed clock signal, the inverted input clock signal, and the last first delayed clock signal according to an embodiment of the present invention.
Figure 10B:
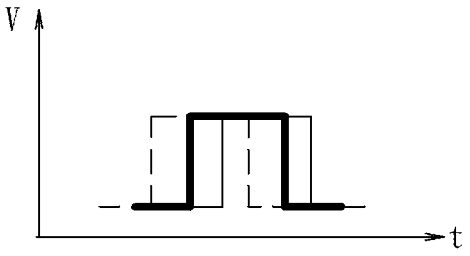
FIG. 10*b* is a schematic diagram illustrating the waveforms of a second delayed clock signal, the inverted input clock signal, and the last first delayed clock signal according to another embodiment of the present invention, wherein the inverted input clock signal is delayed for too short a time.
Figure 10C:
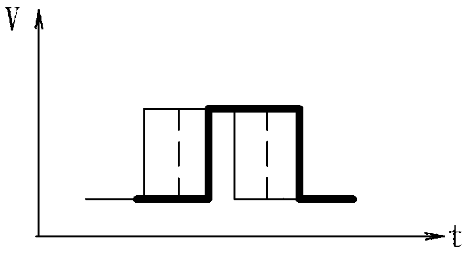
FIG. 10*c* is a schematic diagram illustrating the waveforms of a second delayed clock signal, the inverted input clock signal, and the last first delayed clock signal according to further embodiment of the present invention, wherein the inverted input clock signal is delayed too long.

FIG. 10*a* is a schematic diagram illustrating the waveforms of a second delayed clock signal, the inverted input clock signal, and the last first delayed clock signal according to an embodiment of the present invention. As illustrated in FIG. 9 and FIG. 10*a*, the last first delayed clock signal D31' is represented with a dashed line, the inverted input clock signal $\overline{CI}$ is represented with a thin solid line, and the second delayed clock signal D32' is represented with a thick solid line. When the phase of the second delayed clock signal D32' lags the phase of the inverted input clock signal $\overline{CI}$ and the phase of the inverted input clock signal $\overline{CI}$ lags the phase of the last one D31' of the first delayed clock signals, the control counter 14 keeps the variable current I and the fixed phase difference unchanged. FIG. 10*b* is a schematic diagram illustrating the waveforms of a second delayed clock signal, the inverted input clock signal, and the last first delayed clock signal according to another embodiment of the present invention, wherein the inverted input clock signal is delayed for too short a time. As illustrated in FIG. 9 and FIG. 10*b*, the last first delayed clock signal D31' is represented with a dashed line, the inverted input clock signal $\overline{CI}$ is represented with a thin solid line, and the second delayed clock signal D32' is represented with a thick solid line. When the phase of the second delayed clock signal D32' lags the phase of the last one D31' of the first delayed clock signals and the phase of the inverted input clock signal $\overline{CI}$ lags the phase of the second delayed clock signal D32', the control counter 14 decreases the variable current I to increase the fixed phase difference. FIG. 10*c* is a schematic diagram illustrating the waveforms of a second delayed clock signal, the inverted input clock signal, and the last first delayed clock signal according to further embodiment of the present invention, wherein the inverted input clock signal is delayed too long. As illustrated in FIG. 10*c*, the last first delayed clock signal D31' is represented with a dashed line, the inverted input clock signal $\overline{CI}$ is represented with a thin solid line, and the second delayed clock signal D32' is represented with a thick solid line. When the phase of the last one D31' of the first delayed clock signals lags the phase of the inverted input clock signal $\overline{CI}$ and the phase of the second delayed clock signal D32' lags the phase of the last one D31' of the first delayed clock signals, the control counter 14 increases the variable current I to decrease the fixed phase difference. The conventional technology uses a single phase detector to detect the phases of the first one and the last one of the first delayed clock signals. Compared with the conventional technology, the first phase detector 112 and the second phase detector 113 control and lock a gap between adjacent digital codes to 2 least significant bits (LSB), such that the linearity is closer to an ideal straight line.

Figure 11:
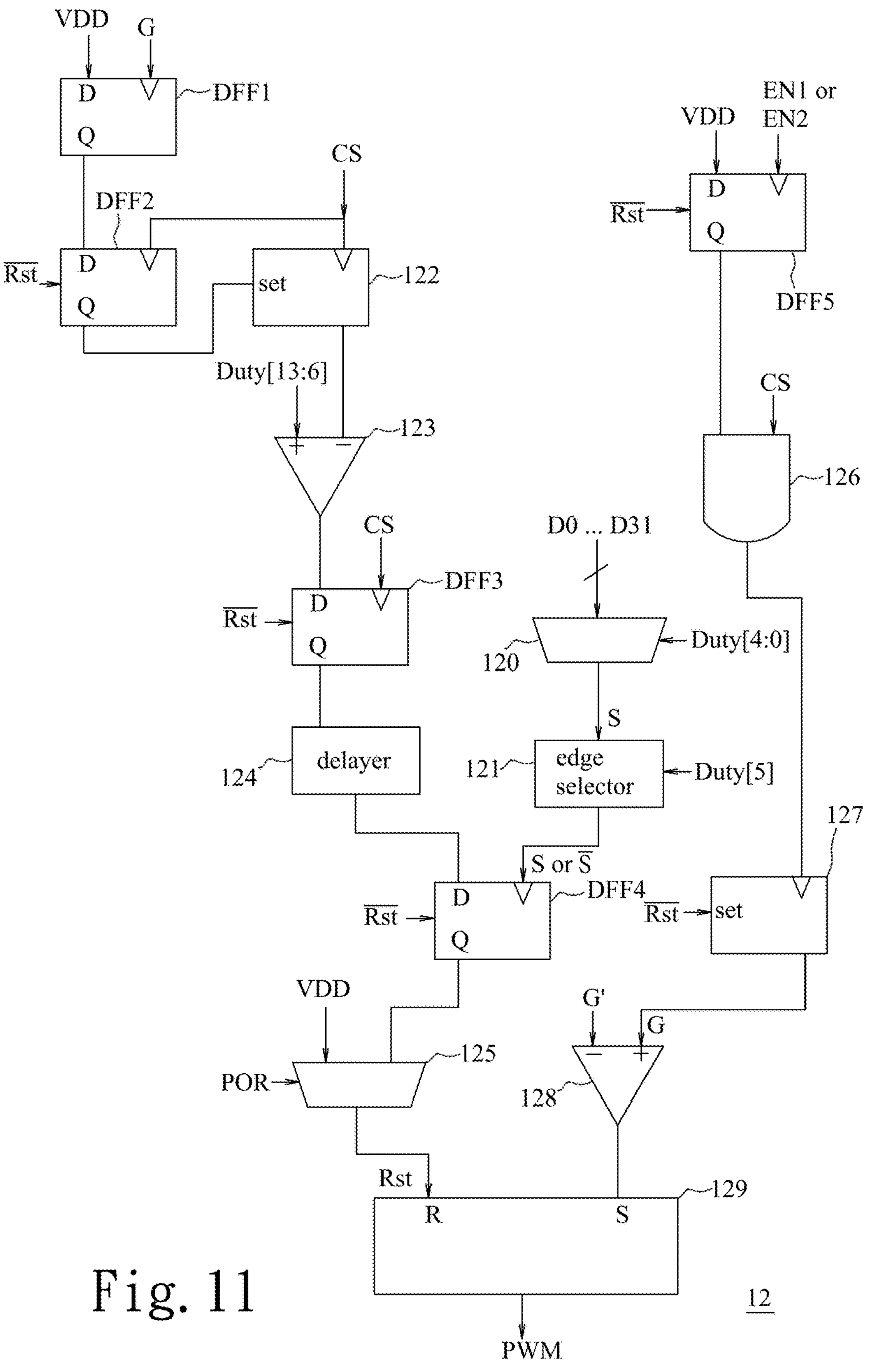
FIG. 11 is a schematic diagram illustrating a digital pulse width modulation logic circuit according to an embodiment of the present invention.

FIG. 11 is a schematic diagram illustrating a digital pulse width modulation logic circuit according to an embodiment of the present invention. Referring to FIG. 11, FIG. 1*a*, and FIG. 5, the input digital code Duty[13:0] includes a first byte Duty[4:0], a dual-edge selection bit Duty[5], and a second byte Duty[13:6]. The first byte Duty[4:0] has n bits. Due to n=5, the first byte Duty[4:0] has 5 bits. The first byte Duty[4:0] includes the value of the first to fifth bits of the input digital code Duty[13:0]. The bit Duty[5] is the fifth bit of the input digital code Duty[13:0]. The second byte Duty[13:6] includes the values from the 7th to 14th bits of the input digital code Duty[13:0]. The digital pulse width modulation logic circuit 12 may include a first multiplexer 10, an edge selector 121, a first D flip-flop DFF1, a second D flip-flop DFF2, a first counter 122, a first comparator 123, a third D flip-flop DFF3, a delayer 124, a fourth D flip-flop DFF4, a second multiplexer 125, a fifth D flip-flop DFF5, an AND gate 126, a second counter 127, a second comparator 128, and a SR latch 129. The S input and the R input of the SR latch 129 are respectively coupled to a signal setting path and a signal resetting path, thereby adjusting the pulse width.

The S input of the SR latch 129 is coupled to the output of the second comparator 128. The R input of the SR latch 129, coupled to the output of the second multiplexer 125, outputs the pulse width modulation signal PWM. The inputs of the first multiplexer 120, coupled to the first buffers 105, receive the first synchronous delayed clock signals D1, D3, . . . , and D31 and the second synchronous delayed clock signals D0, D2, . . . , and D30. The control terminal of the first multiplexer 120 receives the first byte Duty[4:0]. The first multiplexer 120 selects one of the first synchronous delayed clock signals D1, D3, . . . , and D31 and the second synchronous delayed clock signals D0, D2, . . . , and D30 as a delayed output signal S based on the value of the first byte Duty[4:0]. The edge selector 121, coupled to the output of the first multiplexer 120, receives the dual-edge selection bit Duty[5] and the delayed output signal S and keeps or inverts the phase of the delayed output signal S based on the value of the dual-edge selection bit Duty[5] to output the delayed output signal S with an original phase or the inverted delayed output signal $\overline{S}$. The D input of the first D flip-flop DFF1 is coupled to a supply voltage VDD. The clock input of the first D flip-flop DFF1 is coupled to a digital signal G. When the second counter 127 outputs 1, the digital signal G is a high-level voltage. The setting terminal of the second D flip-flop DFF2 is coupled to an inverted reset signal $\overline{Rst}$. The D input of the second D flip-flop DFF2 is coupled to the Q output of the first D flip-flop DFF1. The clock input of the second D flip-flop DFF2 is coupled to the second buffer 105' and the synchronous clock signal CS. The input of the first counter 122 is coupled to the second buffer 105' and the synchronous clock signal CS. The setting terminal of the first counter 122 is coupled to the Q output of the second D flip-flop DFF2. The negative terminal of the first comparator 123 is coupled to the output of the first counter 122. The positive terminal of the first comparator 123 is coupled to the output of the first counter 122. The positive terminal of the first comparator 123 is coupled to the receive the second byte Duty[13:6]. The D input of the third D flip-flop DFF3 is coupled to the output of the first comparator 123. The clock input of the third D flip-flop DFF3 is coupled to the second buffer 105' and the synchronous clock signal CS. The delayer 124 is coupled to the Q output of the third D flip-flop DFF3. The phase delay of a signal caused by the delayer 124 is equal to the phase delay of a signal caused by the first multiplexer 120 and the edge selector 121. The setting terminal of the fourth D flip-flop DFF4 is coupled to the inverted reset signal $\overline{Rst}$. The D input of the fourth D flip-flop DFF4 is coupled to the delayer 124. The clock input of the fourth D flip-flop DFF4 is coupled to the edge selector 121. The input of the second multiplexer 125 is coupled to the Q output of the fourth D flip-flop DFF4 and the supply voltage VDD. The control terminal of the second multiplexer 125 is coupled to the POR signal POR. The second multiplexer 125 outputs a reset signal Rst. When the reset signal Rst=1, the digital pulse width modulation logic circuit 12 stops generating the pulse width. In the signal resetting path, the setting terminal of the fifth D flip-flop DFF5 is coupled to the inverted reset signal $\overline{Rst}$. The D input of the fifth D flip-flop DFF5 is coupled to the supply voltage VDD. The clock terminal of the fifth D flip-flop DFF5 is coupled to one of the input respective enabling signals EN1 and EN2. The inputs of the AND gate 126 are coupled to the second buffer 105', the Q output of the fifth D flip-flop DFF5, and the synchronous clock signal CS. The input of the second counter 127 is coupled to the output of the AND gate 126. The positive terminal of the second comparator 128 is coupled to the output of the second counter 127. The negative terminal of the second comparator 128 is coupled to a digital signal G'. The second counter 127 output the digital signal G. When the digital signal is a high-level voltage and the digital signal G' is a low-level voltage, the second comparator 128 outputs a high-level voltage such that the pulse width starts to be generated.

Specifically, when the input respective enabling signal EN1 or EN2 starts the digital pulse width modulation logic circuit 12, the Q output of the fifth D flip-flop DFF5 outputs 1, the synchronous clock signal CS triggers on the AND gate 126, and the second counter 127 starts to count. When the second counter 127 outputs 1 and the S input of the SR latch 129 receives 1, the pulse width starts to be generated. The dual-edge selection bit Duty[5] selects the rising edge or the falling edge of one of the first synchronous delayed clock signals D1, D3, . . . , and D31 and the second synchronous delayed clock signals D0, D2, . . . , and D30 as the clock signal of the fourth D flip-flop DFF4. The first counter 122 coarsely adjusts the pulse width. When the count value outputted by the first counter 122 is equal to Duty[13:6], the first comparator 123 transmits a high-level voltage to the D input of the third D flip-flop DFF3. The delayer 124 pulls the reset signal Rst high to stop generating the pulse width. When the value of Duty[13:6] increases by 1, the pulse width will extend for one cycle of the clock signal CI.

Figure 12:
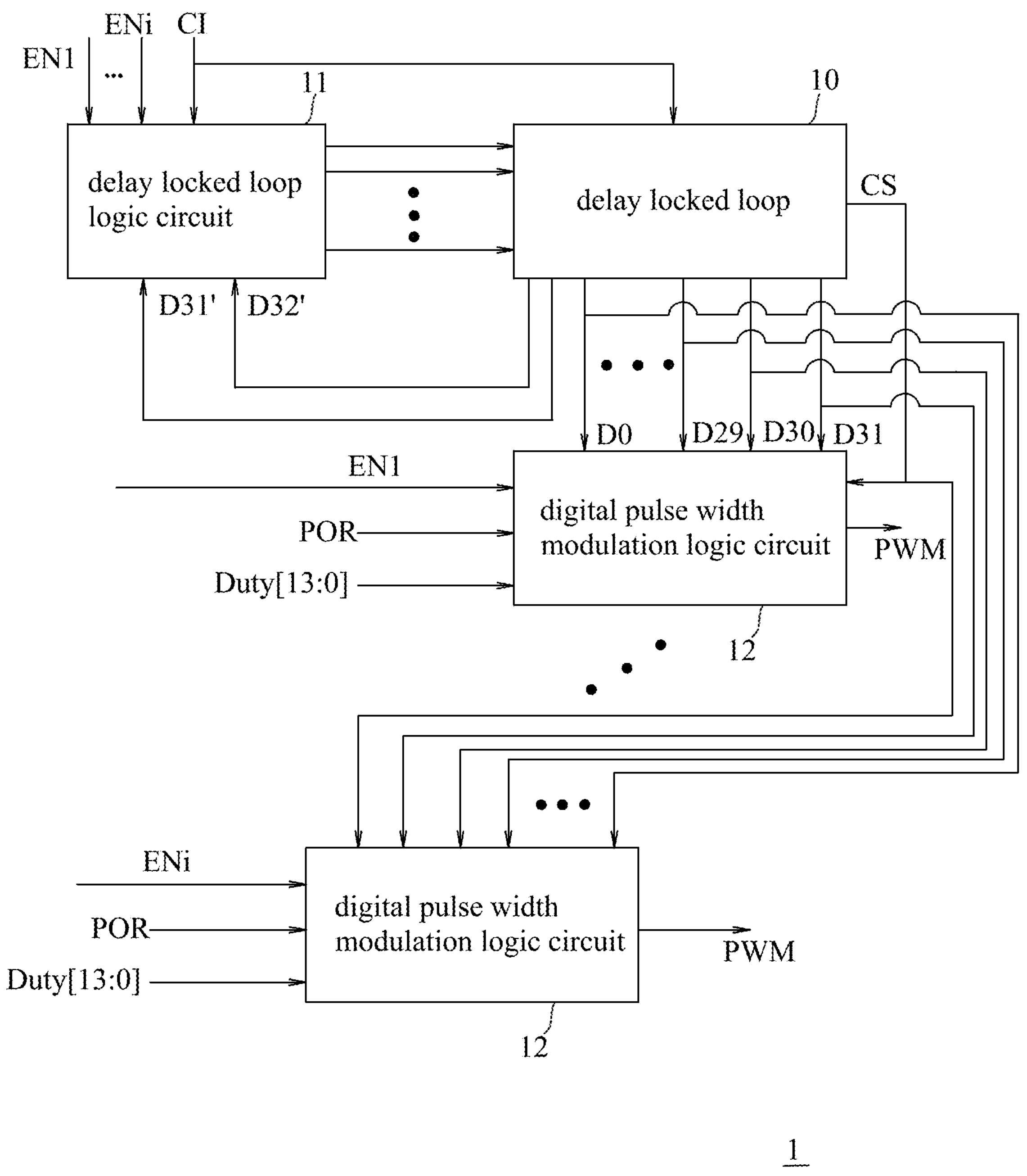
FIG. 12 is a schematic diagram illustrating a multi-phase dual-edge digital pulse width modulation device according to another embodiment of the present invention.

FIG. 12 is a schematic diagram illustrating a multi-phase dual-edge digital pulse width modulation device according to another embodiment of the present invention. Referring to FIG. 12, the embodiment of FIG. 12 is different from the embodiment of FIG. 1*a* in that the embodiment of FIG. 12 uses digital pulse width modulation logic circuits. The multi-phase dual-edge digital pulse width modulation device 1, driven by the input clock signal CI to ensure the matching of different phases of the signal to time, utilizes multiple digital pulse width modulation logic circuits 12 to generate multiple pulse width modulation signals PWM. The digital pulse width modulation logic circuits 12 are respectively configured to receive at least two input respective enabling signals EN1, . . . , and ENi, where i is greater than or equal to 2.

Figure 13:
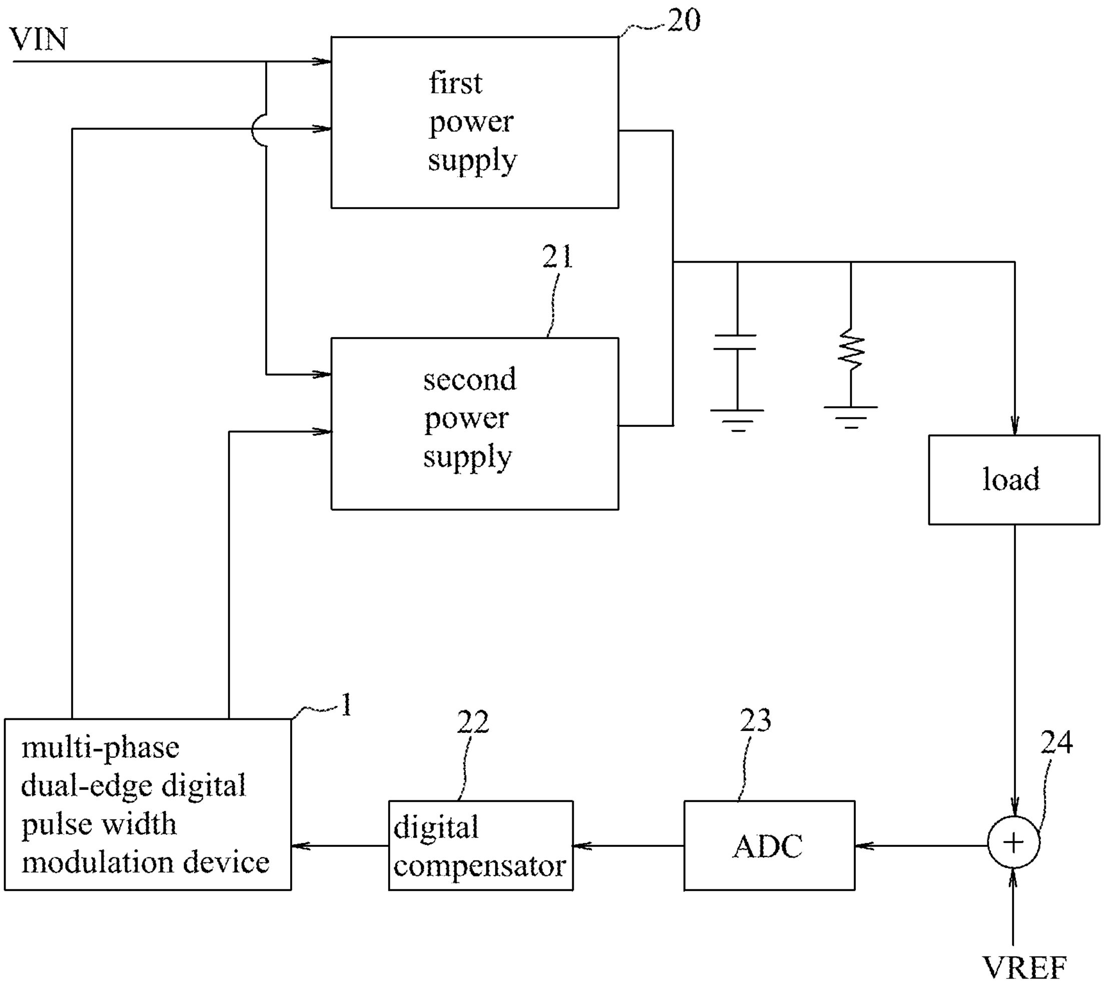
FIG. 13 is a schematic diagram illustrating a multi-phase power conversion system according to an embodiment of the present invention.

FIG. 13 is a schematic diagram illustrating a multi-phase power conversion system according to an embodiment of the present invention. Referring to FIG. 13, the multi-phase dual-edge digital pulse width modulation device 1 is applied to a multi-phase power conversion system that includes a first power supply 20, a second power supply 21, a digital compensator 22, an analog to digital converter (ADC) 23, and an adder 24 and receives an input voltage VIN and a reference voltage VREF. The multi-phase power conversion system provides at least two phases corresponding to the post-stage circuit. When the load is light, the power converter corresponding to each phase can supply current respectively. When the load is heavy, the power converters corresponding to different phases can simultaneously supply current to balance the output current required for a single inductor, thereby extending the component's service life.

Figure 14:
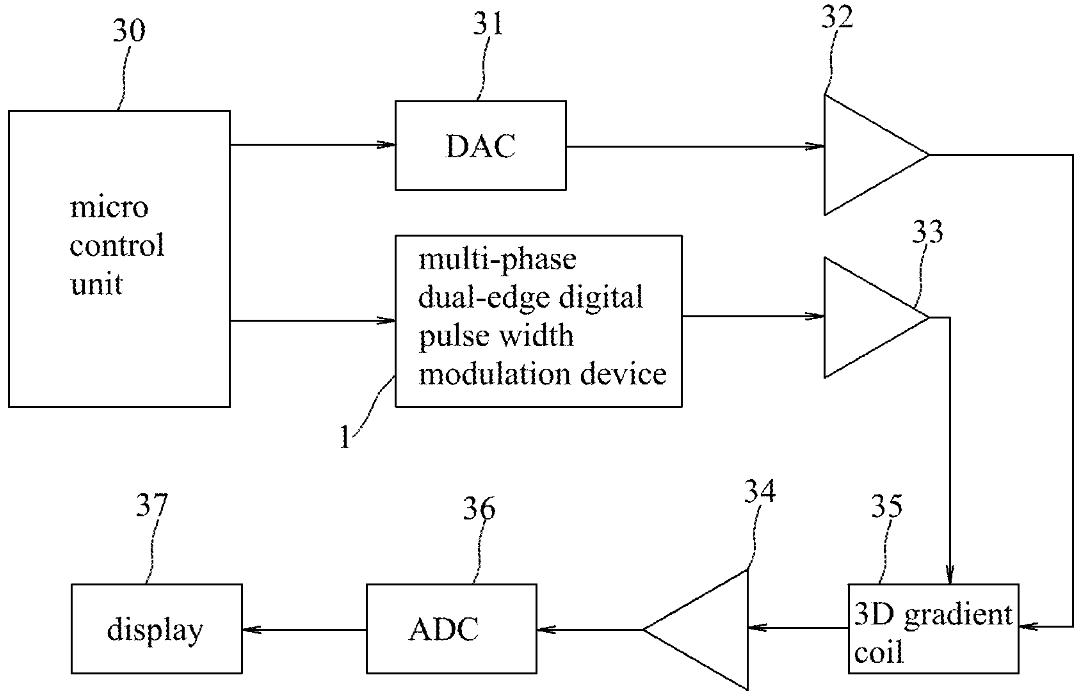
FIG. 14 is a schematic diagram illustrating a magnetic resonance imaging (MRI) system according to an embodiment of the present invention.

FIG. 14 is a schematic diagram illustrating a magnetic resonance imaging (MRI) system according to an embodiment of the present invention. Referring to FIG. 14, the multi-phase dual-edge digital pulse width modulation device 1 is applied to a MRI system that includes a micro control unit 30, a digital to analog converter (DAC) 31, amplifiers 32, 33, and 34, a three-dimensional (3D) gradient coil 35, an analog to digital converter 36, and a display 37. The amplifiers 32 and 33 in the MRI system are responsible for amplifying the received magnetic resonance signals. The present invention can accurately adjust the working mode and the gain of the amplifiers and accurately control the signal amplification process, which helps improve the quality and resolution of the signals.

According to the embodiments provided above, the multi-phase dual-edge digital pulse width modulation device employs closed-loop feedback control to reduce the complexity of digital circuits and maintain system stability and employs a dual-edge inverted delay line to reduce the area and power consumption of a delay line by more than half, improve resolution and linearity, and shorten the startup time required for the delay line.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A multi-phase dual-edge digital pulse width modulation device comprising:

a delay locked loop configured to receive an input clock signal and sequentially generate $2^n$ first delayed clock signals and a second delayed clock signal based on the input clock signal, wherein n is a positive integer greater than 1, there is a fixed phase difference between adjacent two of the first delayed clock signals, there is the fixed phase difference between the second delayed clock signal and a last one of the first delayed clock signals adjacent thereto, all of the first delayed clock signals are divided into a first group and a second group, the first delayed clock signals in the first group and the first delayed clock signals in the second group alternately occur in a time axis, the delay locked loop is configured to blend phases of the input clock signal and the first delayed clock signals in the first group to generate a synchronous clock signal, first synchronous delayed clock signals, and second synchronous delayed clock signals, the first synchronous delayed clock signals and the second synchronous delayed clock signals alternately occur in the time axis, an earliest one and a latest one of the first synchronous delayed clock signals and the second synchronous delayed clock signals are respectively a first one of the second synchronous delayed clock signals and a last one of the first synchronous delayed clock signals, phases of the first delayed clock signals in the first groups are respectively offset from phases of the first synchronous delayed clock signals by a fixed difference, a phase of the synchronous clock signal is offset from a phase of the input clock signal by the fixed difference, phases of the second synchronous delayed clock signals are respectively offset from phases of inverted ones of the first delayed clock signals by the fixed difference, the phase of the synchronous clock signal leads a phase of the first one of the second synchronous delayed clock signals, and an inverted phase of the last one of the first synchronous delayed clock signals leads the phase of the synchronous clock signal;

a delay locked loop logic circuit coupled to the delay locked loop and configured to receive at least two input respective enabling signals, the input clock signal, a last one of the first delayed clock signals, and the second delayed clock signal, thereby adjusting the fixed phase difference; and at least one digital pulse width modulation logic circuit coupled to the delay locked loop and the delay locked loop logic circuit and configured to receive one of the at least two input respective enabling signals, a power-on reset (POR) signal, an input digital code, the synchronous clock signal, the first delayed clock signals, and the second delayed clock signals, thereby generating a pulse width modulation signal, wherein a pulse width of the pulse width modulation signal is positively correlated with a value of the control digital code.

2. The multi-phase dual-edge digital pulse width modulation device according to claim 1, wherein the delay locked loop includes:

a first variable current source and a second variable current source respectively coupled to a high voltage and a low voltage and coupled to the delay locked loop logic circuit, and the delay locked loop logic circuit is configured to control the first variable current source and the second variable current source to generate a variable current;

a delay line coupled between the first variable current source and the second variable current source and coupled to the delay locked loop logic circuit, wherein the delay line is configured to receive the variable current and the input clock signal and sequentially generate the $2^n$ first delayed clock signals and the second delayed clock signal based on the input clock signal and the variable current; and a phase blending circuit coupled to the delay line and the at least one digital pulse width modulation logic circuit and configured to receive the input clock signal and the first delayed clock signals in the first group and blend a phase of the input clock signal and the phases of the first delayed clock signals in the first group to generate the synchronous clock signal, the first synchronous delayed clock signals, and the second synchronous delayed clock signals.

3. The multi-phase dual-edge digital pulse width modulation device according to claim 2, wherein the delay line includes $2^n+2$ inverters coupled in series.

4. The multi-phase dual-edge digital pulse width modulation device according to claim 3, wherein the delay line includes 34 inverters coupled in series.

5. The multi-phase dual-edge digital pulse width modulation device according to claim 2, wherein the delay locked loop further includes $2^n$ first buffers and a second buffer and the $2^n$ first buffers and the second buffer are coupled between the phase blending circuit and the at least one digital pulse width modulation logic circuit.

6. The multi-phase dual-edge digital pulse width modulation device according to claim 5, wherein the input digital code includes a first byte, a dual-edge selection bit, and a second byte and the at least one digital pulse width modulation logic circuit includes:

a first multiplexer with inputs thereof coupled to the $2^n$ first buffers and configured to receive the first synchronous delayed clock signals and the second synchronous delayed clock signals, a control terminal of the first multiplexer is configured to receive the first byte, the first multiplexer is configured to select one of the first synchronous delayed clock signals and the second synchronous delayed clock signals as a delayed output signal based on a value of the first byte;

an edge selector coupled to an output of the first multiplexer and configured to receive the dual-edge selection bit and the delayed output signal and keep or invert a phase of the delayed output signal based on a value of the dual-edge selection bit to output the delayed output signal with an original phase or the inverted delayed output signal;

a first D flip-flop with a D input thereof coupled to a supply voltage;

a second D flip-flop with a clock input thereof coupled to the second buffer and the synchronous clock signal, and a D input of the second D flip-flop is coupled to a Q output of the first D flip-flop;

a first counter with an input thereof coupled to the second buffer and the synchronous clock signal, and a setting terminal of the first counter is coupled to a Q output of the second D flip-flop;

a first comparator with a negative terminal thereof coupled to an output of the first counter and a positive terminal thereof configured to receive the second byte;

a third D flip-flop with a D input coupled to an output of the first comparator and a clock input thereof coupled to the second buffer and the synchronous clock signal;

a delayer coupled to a Q output of the third D flip-flop, wherein a phase delay of a signal caused by the delayer is equal to a phase delay of a signal caused by the first multiplexer and the edge selector;

a fourth D flip-flop with a D input thereof coupled to the delayer and a clock input thereof coupled to the edge selector;

a second multiplexer with an input thereof coupled to a Q output of the fourth D flip-flop and the supply voltage and a control terminal thereof coupled to the POR signal;

a fifth D flip-flop with a D input thereof coupled to the supply voltage and a clock input thereof coupled to the delay locked loop logic circuit and one of the at least two input respective enabling signals;

an AND gate with inputs thereof coupled to the second buffer, a Q output of the fifth D flip-flop, and the synchronous clock signal;

a second counter with an input thereof coupled to an output of the AND gate;

a second comparator with a positive terminal thereof coupled to an output of the second counter; and a SR latch with a S input thereof coupled to an output of the second comparator and an R input thereof coupled to an output of the second multiplexer and configured to output the pulse width modulation signal.

7. The multi-phase dual-edge digital pulse width modulation device according to claim 6, wherein the first byte has n bits.

8. The multi-phase dual-edge digital pulse width modulation device according to claim 7, wherein the input digital code has 14 bits.

9. The multi-phase dual-edge digital pulse width modulation device according to claim 1, wherein the delay locked loop logic circuit includes:

an OR gate configured to receive the at least two input respective enabling signals, thereby generating an output respective enabling signal;

a phase detecting and setting circuit coupled to the OR gate and configured to receive the input clock signal, the POR signal, and the output respective enabling signal, wherein when the POR signal and the output respective enabling signal are high-level voltages, the phase detecting and setting circuit temporarily generates a set signal;

an inverter configured to receive and invert the input clock signal to generate the inverted input clock signal;

a first phase detector coupled to the phase detecting and setting circuit, the inverter, and the delay line and configured to receive the set signal, the inverted input clock signal, and the last one of the first delayed clock signals to detect a first phase difference between the inverted input clock signal and the last one of the first delayed clock signals;

a second phase detector coupled to the phase detecting and setting circuit and the delay line and configured to receive the set signal, the last one of the first delayed clock signals, and the second delayed clock signal to detect a second phase difference between the last one of the first delayed clock signals and the second delayed clock signal; and a control counter coupled to the first phase detector, the second phase detector, the first variable current source, and the second variable current source and configured to receive the first phase difference and the second phase difference, wherein when a phase of the second delayed clock signal lags a phase of the inverted input clock signal and the phase of the inverted input clock signal lags a phase of the last one of the first delayed clock signals, the control counter keeps the variable current and the fixed phase difference unchanged, when the phase of the second delayed clock signal lags the phase of the last one of the first delayed clock signals and the phase of the inverted input clock signal lags the phase of the second delayed clock signal, the control counter decreases the variable current to increase the fixed phase difference, and when the phase of the last one of the first delayed clock signals lags the phase of the inverted input clock signal and the phase of the second delayed clock signal lags the phase of the last one of the first delayed clock signals, the control counter increases the variable current to decrease the fixed phase difference.

10. The multi-phase dual-edge digital pulse width modulation device according to claim 1, wherein the at least one digital pulse width modulation logic circuit includes a plurality of digital pulse width modulation logic circuits that are respectively configured to receive the at least two input respective enabling signals.

* * * * *